(12) United States Patent
Demarets et al.

(10) Patent No.: US 12,418,279 B2
(45) Date of Patent: Sep. 16, 2025

(54) LOW POWER VOLTAGE CONTROLLABLE OSCILLATOR WITH RAIL-TO-RAIL OUTPUT

(71) Applicant: NXP B.V., Eindhoven (NL)

(72) Inventors: Maël Demarets, Huppaye (BE); Gerard Villar Piqué, Eindhoven (NL); Sander Derksen, Hank (NL); Fabio Sebastiano, Den Hoorn (NL)

(73) Assignee: NXP B.V., Eindhoven (NL)

( * ) Notice: Subject to any disclaimer, the term of this patent is extended or adjusted under 35 U.S.C. 154(b) by 6 days.

(21) Appl. No.: 18/696,599

(22) PCT Filed: Sep. 29, 2021

(86) PCT No.: PCT/IB2021/000652
§ 371 (c)(1),
(2) Date: Mar. 28, 2024

(87) PCT Pub. No.: WO2023/052800
PCT Pub. Date: Apr. 6, 2023

(65) Prior Publication Data
US 2024/0396532 A1 Nov. 28, 2024

(51) Int. Cl.
*H03K 3/03* (2006.01)
(52) U.S. Cl.
CPC .................. *H03K 3/0315* (2013.01)
(58) Field of Classification Search
CPC .................................................. H03K 3/0315
(Continued)

(56) References Cited

U.S. PATENT DOCUMENTS 5,475,344 A * 12/1995 Maneatis ................. H03K 3/03
331/25
6,188,291 B1 * 2/2001 Gopinathan ........... H03B 27/00
331/172
(Continued)

FOREIGN PATENT DOCUMENTS

JP 2013207339 A 10/2013

OTHER PUBLICATIONS

Chen, P., "A 0.84pJ/cycle Wheatstone Bridge Based CMOS RC Oscillator with Reconfigurable Frequencies", 2019 IEEE Custom Integrated Circuits Conference (CICC), Apr. 14-17, 2019.
(Continued)

*Primary Examiner* — Joseph Chang

(57) ABSTRACT

A controllable oscillator including an upper oscillator coupled between an upper supply voltage and an upper intermediate node that provides at least one upper oscillating signal on at least one upper oscillating node, a lower oscillator coupled between a lower intermediate node and a lower supply voltage that provides at least one lower oscillating signal on at least one lower oscillating node, an oscillation controller coupled between the upper and lower intermediate nodes, and amplification circuitry coupled between the upper and lower supply voltages, having at least one upper input coupled to the at least one upper oscillating node, having at least one lower input coupled to the at least one lower oscillating node, and having a primary output node for providing a primary rail-to-rail oscillation signal. A coupling circuit may be coupled between one or more upper and lower oscillating nodes for synchronization.

20 Claims, 9 Drawing Sheets

(58) Field of Classification Search
USPC .......................................................... 331/57
See application file for complete search history.

(56) References Cited

U.S. PATENT DOCUMENTS

| | | | | |
|---|---|---|---|---|
| 2002/0067215 | A1* | 6/2002 | Takenaka | H03K 5/133 331/57 |
| 2016/0126887 | A1 | 5/2016 | Tenbroeck | |
| 2017/0170722 | A1* | 6/2017 | Jung | H02M 3/07 |
| 2018/0367097 | A1 | 12/2018 | Martineau | |

OTHER PUBLICATIONS

Choi, M., "A 99nW 70.4kHz Resistive Frequency Locking On-Chip Oscillator with 27.4ppm/° C. Temperature Stability", 2015 Symposium on VLSI Circuits (VLSI Circuits), Jun. 17-19, 2015.

Ding, M., "A 0.7-V 0.43-pJ/cycle Wakeup Timer based on a Bang-bang Digital-Intensive Frequency-Locked-Loop for IoT Applications", IEEE Solid-State Circuits Letters, vol. 1, No. 2, pp. 30-33, Feb. 2018.

Ghosh, D., "A 10 GHz Low Phase Noise VCO Employing Current Reuse and Capacitive Power Combining", IEEE Custom Integrated Circuits Conference 2020, Sep. 19-22, 2010.

Gurleyuk, C., "A CMOS Dual-RC Frequency Reference With ±200-ppm Inaccuracy From -45° C. to 85° C.", IEEE Journal of Solid-State Circuits, vol. 3, Issue 12, Dec. 2018.

Ha, K., "Gm-Boosted Complementary Current-Reuse Colpitts VCO With Low Power and Low Phase Noise", IEEE Microwave and Wireless Components Letters, vol. 24, No. 6, Jun. 2014.

Lee, I., "A Constant Energy-Per-Cycle Ring Oscillator Over a Wide Frequency Range for Wireless Sensor Nodes", IEEE Journal of Solid-State Circuits, vol. 51, No. 3, Mar. 2016.

Truesdell, D., "A 0.5V 560KHz 18.8fJ/Cycle Ultra-Low Energy Oscillator in 65nm CMOS with 96.1ppm/° C. Stability Using a Duty-Cycled Digital Frequency-Locked Loop", 2020 IEEE Symposium on VLSI Circuits, Jun. 16-19, 2020.

Zhang, J., "Analysis and Design of Ultra-Wideband mm-Wave Injection-Locked Frequency Dividers Using Transformer-Based High-Order Resonators", IEEE Journal of Solid-State Circuits, vol. 53, No. 8, Aug. 2018.

Zhou, Y., "Subthreshold CMOS Active Inductors with Applications to Low-Power Injection-Locked Oscillators for Passive Wireless Microsystems", 2010 53rd IEEE International Midwest Symposium on Circuits and Systems, Aug. 1-4, 2010.

* cited by examiner

LOW POWER VOLTAGE CONTROLLABLE OSCILLATOR WITH RAIL-TO-RAIL OUTPUT

BACKGROUND

Field of the Invention

The present invention relates in general to oscillators, and more particularly to a low power controllable oscillator that provides a rail-to-rail output signal.

Description of the Related Art

Clock generation is a widespread need in any mixed-signal or digital system. Clock signals can be used, for example, to clock a digital processing circuit, to sample analog signals in an analog-to-digital converter (ADC) or a digital-to-analog converter (DAC), to run the power stage of a power converter, to run the control loop of a digital low dropout regulator (LDO), to monitor a signal with a clocked comparator or the like, among many other possible uses.

In low power (LP) applications including ultra low power (ULP) applications, such as those constrained to less than about 10 microwatts (W), the power overhead due to clock generation can be a significant fraction of the overall power consumption. Thus, generating a clock signal with low power, such as less than about 50 nanowatts (nW), can be of high interest. Actually, low power clock generation may enable many other applications and signal monitoring if the power overhead is low enough. Even in systems in which a clock signal is already present, a clock generator that requires less power than distributing the existent clock may result in an overall power reduction. Generating a clock signal with low power or ultra low power is particularly relevant in many low power applications, such as energy autonomous nodes for Internet of Things (IoT), microcontrollers that remain in stand-by mode for long periods of time, etc.

Conventional solutions typically rely on low bias current generation circuits which still require non-negligible power consumption or rely on reduction of the overall supply voltage, resulting in an output swing that is too small. Conventional solutions suffer either from a small voltage swing (far from nominal supply of the corresponding technology node) or very slow rising/falling edges that cannot directly clock the following gates. Indeed, such slow signals create large shot-through current in subsequent CMOS logic. Consequently, these conventional solutions lead to additional requirements on the clock generator to achieve low power consumption in the rest of the circuit as well, such as level-shifting, edge restoration, etc.

BRIEF DESCRIPTION OF THE DRAWINGS

Embodiments of the present invention are illustrated by way of example and are not limited by the accompanying figures. Similar references in the figures may indicate similar elements. Elements in the figures are illustrated for simplicity and clarity and have not necessarily been drawn to scale.

DETAILED DESCRIPTION

A low power controllable oscillator with rail-to-rail output as described herein includes DC-shifted ring oscillators and embedded amplification and buffering which provides a rail-to-rail oscillating signal with fast transitions. The ring oscillators are stacked in series with an intermediate controller that may receive a control signal for controlling frequency. Amplification circuitry is responsive to outputs and other phase-shifted nodes of the ring oscillators to level shift the oscillating signals to a rail-to-rail oscillation signal. Buffer circuitry may be provided to additionally optimize transition times of the rail-to-rail oscillation signal to provide an output oscillating signal with sharp edges. The output voltage signal presents sufficiently fast transition edges so that power consumption of a digital gate connected to its output is minimized by minimizing the gate's shot-through current. The power consumption of an oscillator as described herein is well below the power consumption of any equivalent conventional solution. The oscillator as described herein can be used as a building block within any regular closed-loop oscillator.

Figure 1:
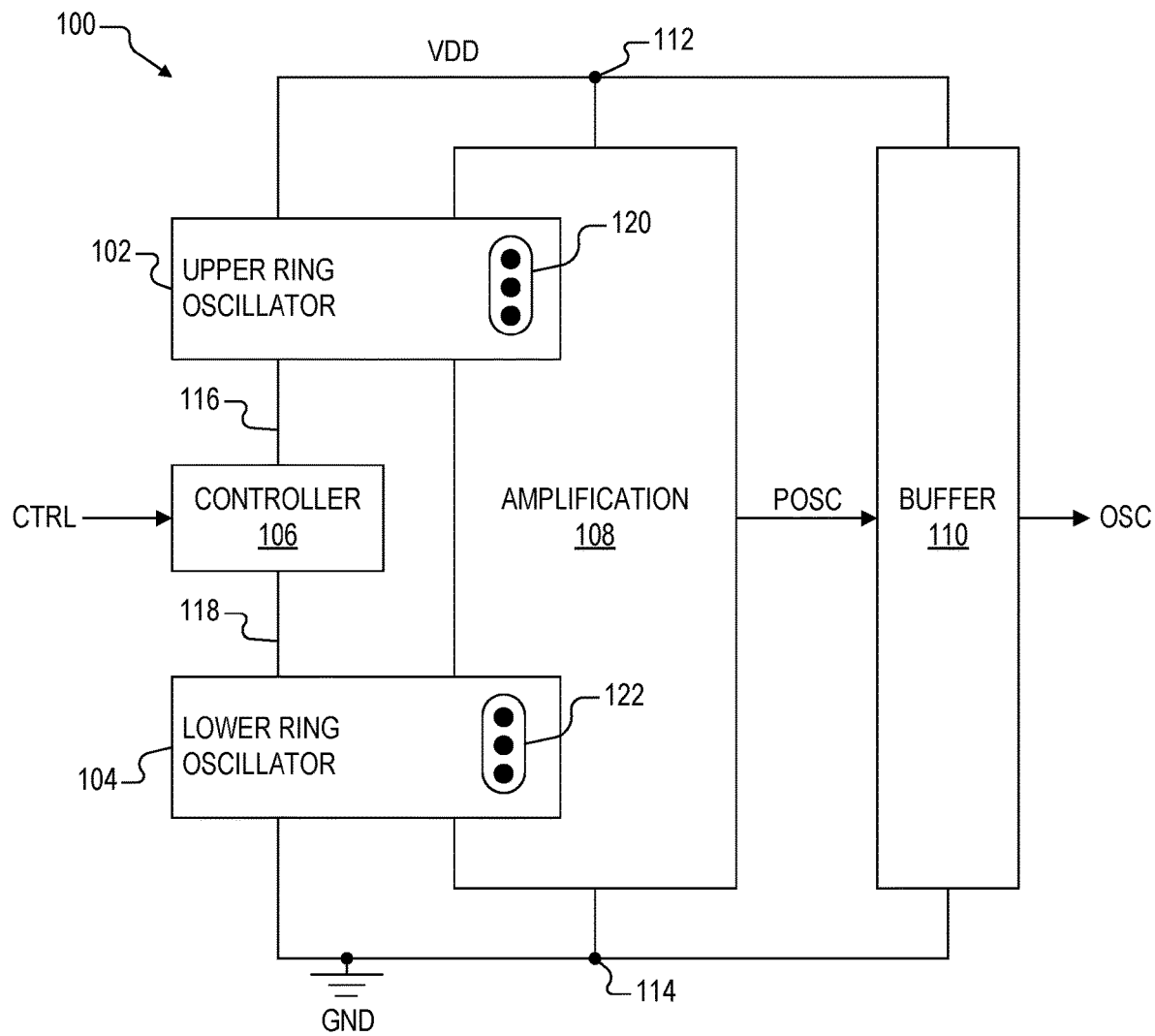
FIG. 1 is a simplified block diagram of a controllable oscillator implemented according to an embodiment of the present disclosure.

FIG. 1 is a simplified block diagram of a controllable oscillator 100 implemented according to an embodiment of the present disclosure. The oscillator 100 includes an upper ring oscillator 102, a lower ring oscillator 104, a controller 106, amplification circuitry 108 including one or more amplification stages, and buffer circuitry 110 including one or more buffer stages. The oscillator 100 is coupled to receive power from an upper supply voltage rail 112 developing an upper supply voltage VDD and a lower supply voltage rail 114 developing a lower supply voltage or reference voltage, such as ground (GND). The upper ring oscillator 102 is coupled between VDD and an upper intermediate node 116 and the lower ring oscillator 104 is coupled between a lower intermediate node 118 and GND.

The controller 106 is coupled between the upper and lower intermediate nodes 116 and 118 and receives a control signal CTRL. The amplification circuitry 108 and the buffer circuitry 110 are both coupled between VDD and GND. The upper ring oscillator 102 has multiple outputs and the amplifier stage 108 has multiple upper inputs that are coupled together through a set of upper nodes 120 as further described herein. The lower ring oscillator 104 has multiple outputs and the amplifier stage 108 has multiple lower inputs that are coupled together through a set of lower nodes 122 as further described herein.

The upper ring oscillator 102 generates multiple (e.g., three) upper oscillating signals that transition within an upper voltage range (UVR, FIG. 3) between VDD and a voltage of the upper intermediate node 116, and the lower ring oscillator 104 generates multiple (e.g., three) lower oscillating signals that transition within a lower voltage range (LVR) between a voltage of the lower intermediate node 118 and GND. The current through the upper and lower ring oscillators 102 and 104 is modulated by the controller 106 as controlled by the CTRL signal. The controller 106 may be implemented in any suitable manner, such as one or more transistors or switched capacitors or the like, in which the oscillator 100 may be classified as a voltage-controlled oscillator (VCO), a current-controlled oscillator (CCO), or a digital-controlled oscillator (DCO). By adjusting CTRL (which could be a voltage signal, a current signal, a digital signal, etc.), and thus the supply current through the upper and lower ring oscillators 102 and 104, the controller 106 determines the corresponding delays which in turn adjusts the oscillation frequency of the upper and lower ring oscillators 102 and 104. The series connection of the upper and lower ring oscillators 102 and 104 and the controller 106 forces the same current through each of them leading to the same nominal oscillation frequency in steady state. The amplification circuitry 108 converts the upper and lower oscillation signals of the ring oscillators 102 and 104 into a primary oscillation signal POSC that transitions between VDD and GND. The buffer circuitry 110 may be provided to increase or otherwise improve the transitions of the POSC signal to provide the output oscillating signal OSC, which also transitions between VDD and GND.

Figure 2:
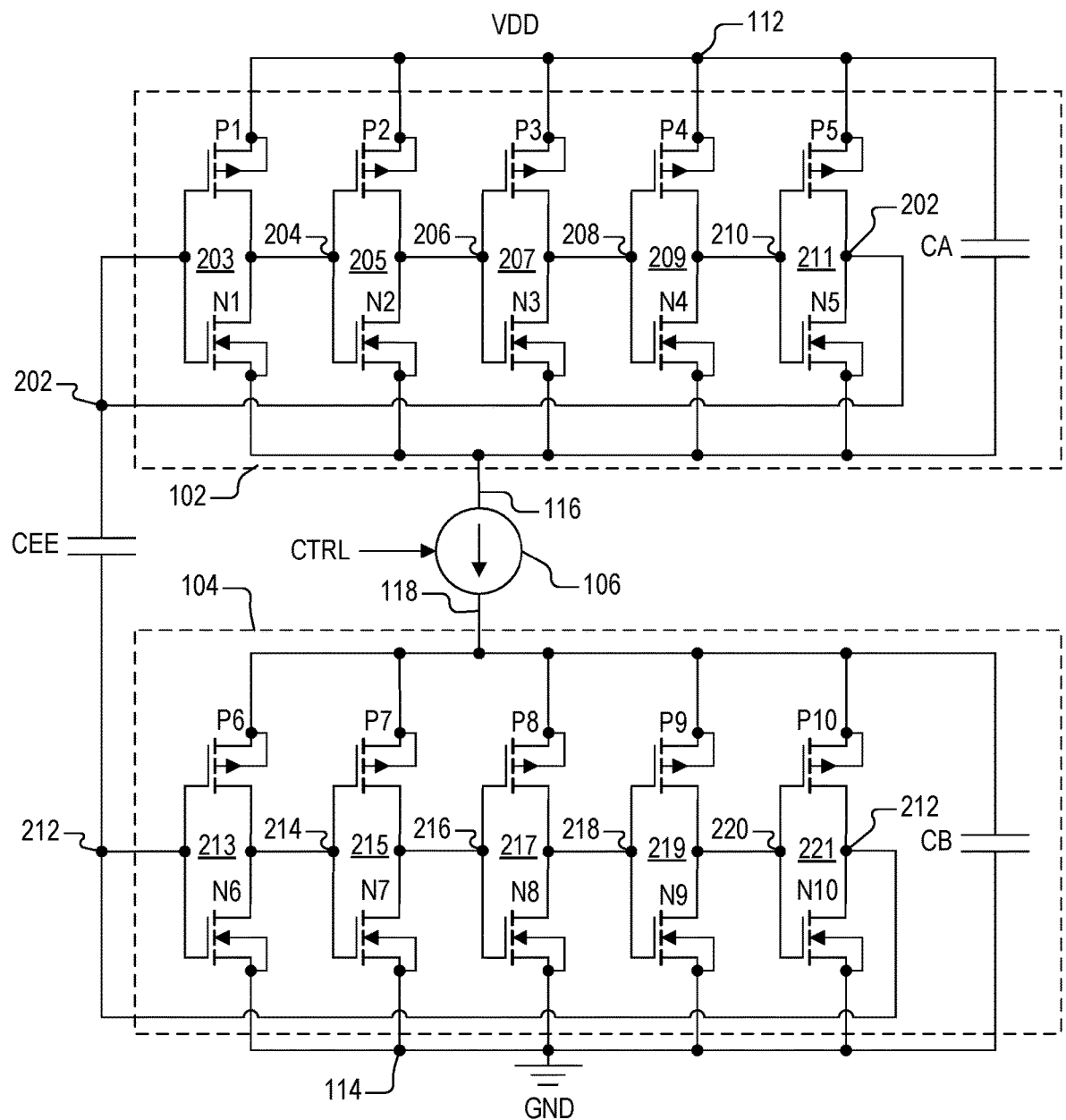
FIG. 2 is a schematic diagram of the upper and lower ring oscillators of FIG. 1 implemented according to one embodiment of the present disclosure.

FIG. 2 is a schematic diagram of the upper and lower ring oscillators 102 and 104 implemented according to one embodiment of the present disclosure. The controller 106, which is coupled between the intermediate nodes 116 and 118, is represented as a current source controlled by CTRL. The upper ring oscillator 102 includes P-channel devices P1, P2, P3, P4, and P5 and N-channel devices N1, N2, N3, N4, and N5. The P-channel devices P1-P5 each have one current terminal coupled to the voltage rail (VDD) and the N-channel devices N1-N5 each have one current terminal coupled to the upper intermediate node 116. The other current terminals of P1 and N1 are coupled together at a node 204, the other current terminals of P2 and N2 are coupled together at a node 206, the other current terminals of P3 and N3 are coupled together at a node 208, the other current terminals of P4 and N4 are coupled together at a node 210, and the other current terminals of P5 and N5 are coupled together at a node 202. The P-channel devices P1-P5 each have a control terminal coupled to respective control terminals of the N-channel devices N1-N5 at nodes 202, 204, 206, 208, and 210, respectively. In this manner, P1 and N1 form a first inverter 203 having an input coupled to node 202 and an output coupled to node 204, P2 and N2 form a second inverter 205 having an input coupled to node 204 and an output coupled to node 206, P3 and N3 form a third inverter 207 having an input coupled to node 206 and an output coupled to node 208, P4 and N4 form a fourth inverter 209 having an input coupled to node 208 and an output coupled to node 210, and P5 and N5 form a fifth inverter 211 having an input coupled to node 210 and an output coupled to node 202. The inverters of the upper ring oscillator 102 are coupled in series and also in a ring configuration in which the output of the last inverter 211 is coupled to the input of the first inverter 203 at node 202, in which node 202 is also an upper output node that provides an upper oscillating signal to an upper input of the amplification circuitry 108.

The lower ring oscillator 104 is configured in substantially similar manner as the upper ring oscillator 102 and includes P-channel devices P6, P7, P8, P9, and P10 and N-channel devices N6, N7, N8, N9, and N10. The P-channel devices P6-P10 each have one current terminal coupled to the lower intermediate node 118 and the N-channel devices N6-N10 each have one current terminal coupled to the lower supply voltage rail 114 (GND). The other current terminals of P6 and N6 are coupled together at a node 214, the other current terminals of P7 and N7 are coupled together at a node 216, the other current terminals of P8 and N8 are coupled together at a node 218, the other current terminals of P9 and N9 are coupled together at a node 220, and the other current terminals of P10 and N10 are coupled together at a node 212. The P-channel devices P6-P10 each have a control terminal coupled to respective control terminals of the N-channel devices N6-N10 at the nodes 212, 214, 216, 218, and 220, respectively. In this manner, P6 and N6 form a first inverter 213 having an input coupled to node 212 and an output coupled to node 214, P7 and N7 form a second inverter 215 having an input coupled to node 214 and an output coupled to node 216, P8 and N8 form a third inverter 217 having an input coupled to node 216 and an output coupled to node 218, P9 and N9 form a fourth inverter 219 having an input coupled to node 218 and an output coupled to node 220, and P10 and N10 form a fifth inverter 221 having an input coupled to node 220 and an output coupled to node 212. The inverters of the lower ring oscillator 104 are also coupled in series in a ring configuration in which the output of the last inverter 221 is coupled to the input of the first inverter 213 at node 212, in which node 212 is also a lower output node that provides a lower oscillating signal to a lower input of the amplification circuitry 108.

The P-channel devices P1-P10 and the N-channel devices N1-N10 are depicted as MOS transistors, each having drain and source terminals as current terminals and gate terminals as control terminals. In this manner, the source terminals of P1-P5 are coupled to VDD, the source terminals of P6-P10 are coupled to the lower intermediate terminal 118, the source terminals of N1-N5 are coupled to the upper intermediate node 116, and the source terminals of N6-N10 are coupled to GND. Each of the MOS transistors P1-P10 and N1-N10 are shown with a body diode or bulk connection coupled to its source terminal. It is understood that the bulks of the devices might also be coupled to other nodes such as VDD (in case of the PMOS devices) or to GND (in case of the NMOS devices), in order to achieve a different trade-off between area and performance. The drain terminals of P1 & N1, P2 & N2, P3 & N3, P4 & N4, P5 & N5, P6 & N6, P7 & N7, P8 & N8, P9 & N9, and P10 & N10 are coupled together at nodes 204, 206, 208, 210, 202, 214, 216, 218, 220, and 212, respectively. It is understood that alternative types of transistor devices may be used. A decoupling capacitor CA is coupled between VDD and the upper intermediate node 116, a decoupling capacitor CB is coupled between the lower intermediate node 118 and GND, and a coupling capacitor CEE is coupled between nodes 202 and 212. It is noted that the decoupling capacitors CA and CB may be omitted, although such decoupling tends to facilitate synchronization between the upper and lower ring oscillators 102 and 104.

The capacitor CEE is a floating coupling capacitor that synchronizes the phase and frequency of the ring oscillators 102 and 104. The capacitance of CEE may be determined by an expected amount of mismatch between the two ring oscillators 102 and 104. Although in this particular embodiment a single capacitor (e.g., CEE) is used as a coupling mechanism between the upper and the lower oscillators, other coupling devices or circuits (or even more than one) could be used as a synchronization mechanism between the 2 ring oscillators. For example, coupling devices or circuits may be coupled between nodes 204 and 214, between nodes 206 and 216, etc. The series connection of the two ring-oscillators 102 and 104 with the controller 106 forces the same current through each leading to the same oscillation frequency in steady state. By adjusting the supply currents of the inverter rings via CTRL, the controller 106 also determines the delay of each of the inverters and, as a result, the oscillation frequency of both of the ring oscillators 102 and 104. The decoupling capacitors CA and CB are used to achieve voltage stability of the upper and lower intermediate nodes 116 and 118, which also contributes to synchronize the operation of the ring oscillators 102 and 104. It is noted that although the ring oscillators 102 and 104 each include a series of 5 cascaded inverters, in alternative embodiments, the number of inverters used to implement the ring oscillators may vary from one embodiment to another as well as the sizing of the devices, as this can be used, for example, to determine the operating frequency of the oscillator.

Figure 3:
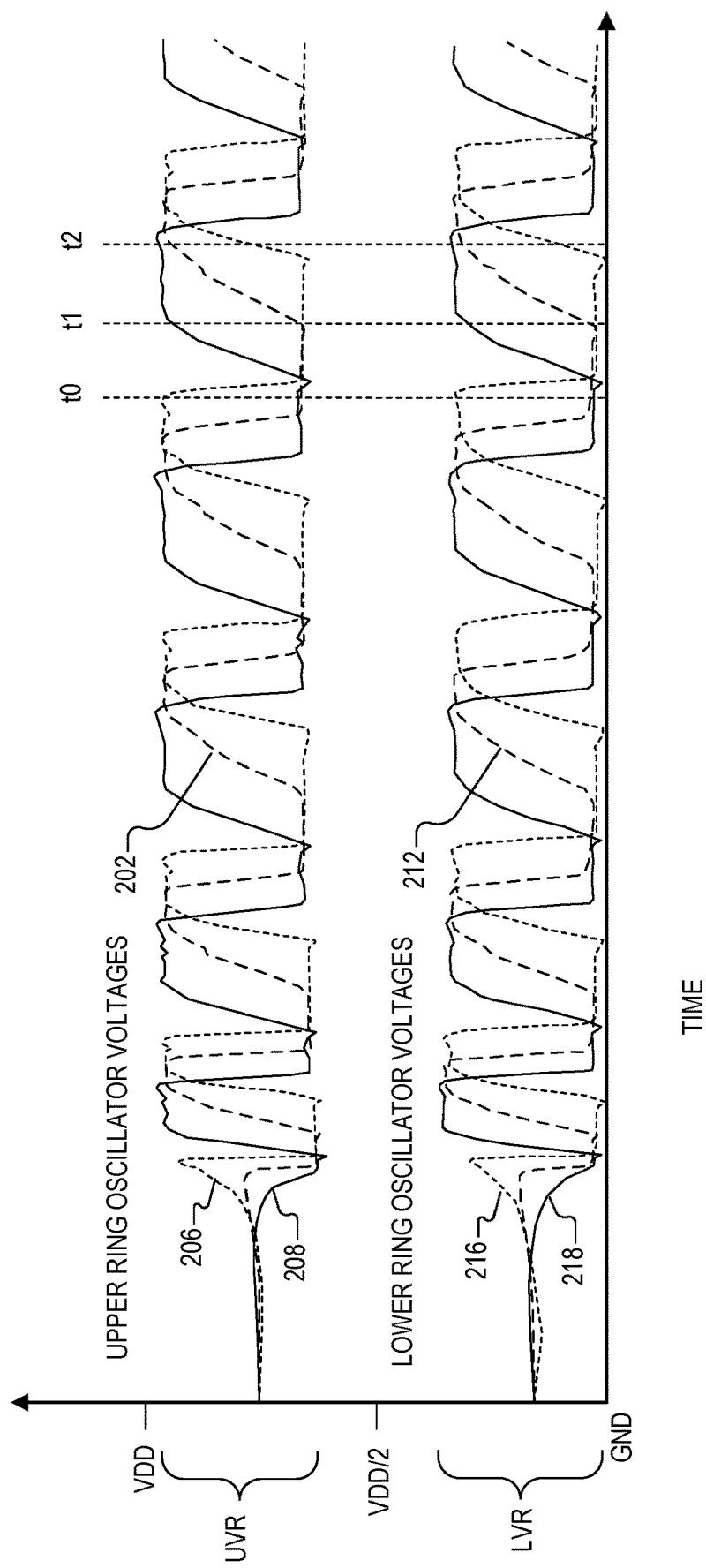
FIG. 3 is a timing diagram plotting the voltages of nodes of the upper and lower ring oscillators of FIG. 2 according to one embodiment of the present disclosure.

FIG. 3 is a timing diagram plotting the voltages of nodes 202 (dashed line), 206 (dotted line) and 208 (solid line) of the upper ring oscillator 102 and the voltages of nodes 212 (dashed line), 216 (dotted line) and 218 (solid line) of the lower ring oscillator 104 according to one embodiment of the present disclosure. The voltages of nodes 202, 206 and 208 each oscillate within the upper voltage range UVR between VDD/2 and VDD, while the voltages of nodes 212, 216 and 218 each oscillate within the lower voltage range LVR between GND and VDD/2. Thanks to capacitive coupling, the corresponding pair of nodes 202 and 212 oscillate at the same frequency and phase with respect to each other. In the rest of the ring, the corresponding pair of nodes 206 and 216 oscillate at the same frequency and about the same phase with respect to each other (which depends upon any mismatch) but at a delayed phase relative to the pair of nodes 202 and 212, the corresponding pair of nodes 208 and 218 oscillate at the same frequency and about the same phase with respect to each other but at a delayed phase relative to the pair of nodes 206 and 216, and the corresponding pair of nodes 210 and 220 oscillate at the same frequency and about the same phase with respect to each other but at a delayed phase relative to the pair of nodes 208 and 218. This is true in spite of mismatch in gate delays because of the coupling mechanism. Each of the ring oscillators 102 and 104 hence generate several low-voltage clock signals with the same frequencies but different phases at the different inverting stages. Additionally, by stacking them together in the manner shown, the upper and lower ring oscillators 102 and 104 produce copies of the same low-voltage (or even subthreshold) signals at the corresponding nodes, except that UVR is DC-shifted up towards VDD while LVR is DC-shifted down towards GND.

Figure 4:
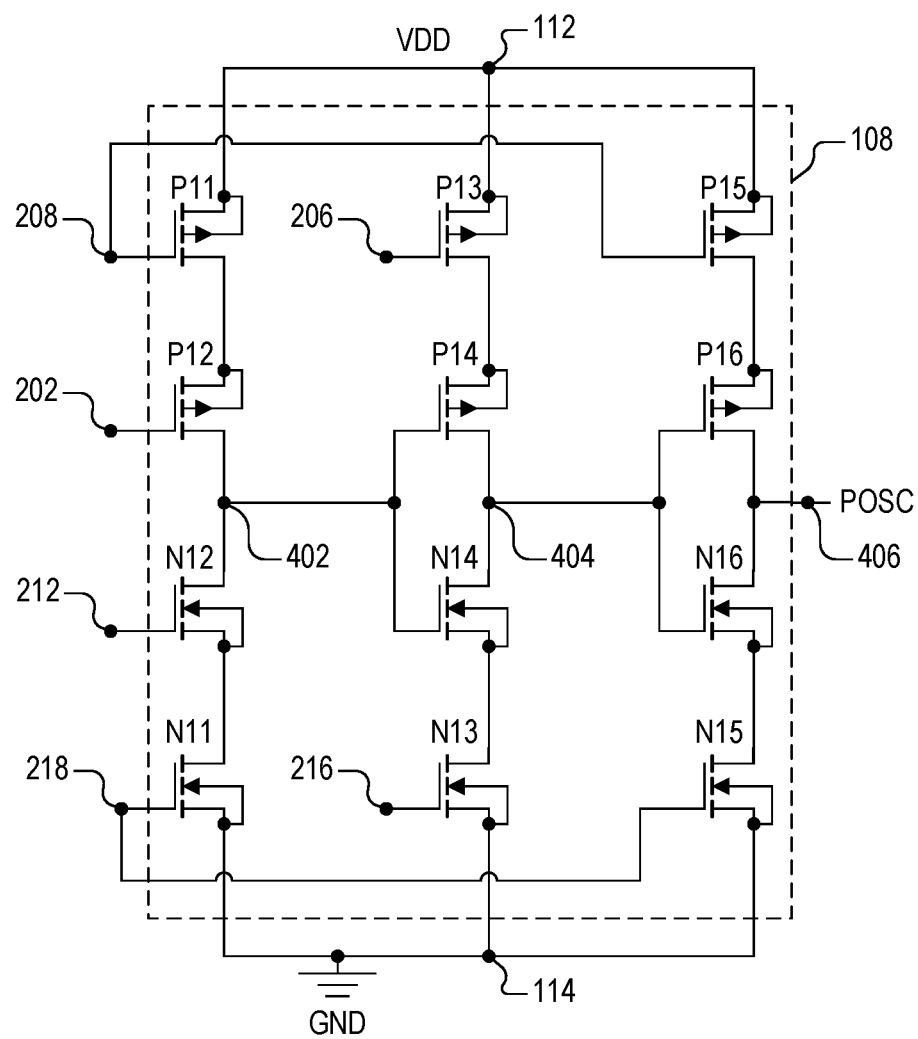
FIG. 4 is a schematic diagram of the amplification circuitry of FIG. 1 implemented according to one embodiment of the present disclosure.

FIG. 4 is a schematic diagram of the amplification circuitry 108 implemented according to one embodiment of the present disclosure. The amplification circuitry 108 includes P-channel devices P11, P12, P13, P14, P15, and P16, and N-channel devices N11, N12, N13, N14, N15, and N16. The P-channel and N-channel devices are depicted as MOS transistors in a similar manner as the upper and lower ring oscillators 102 and 104, in which it is understood that alternative types of transistor devices may be used. P11, P13, and P15 each have a source terminal and a bulk connection coupled to VDD. P12 has a source terminal and bulk connection coupled to a drain terminal of P11 and a drain terminal coupled to a center node 402. P14 has a source terminal and bulk connection coupled to a drain terminal of P13 and a drain terminal coupled to another center node 404. P16 has a source terminal and bulk connection coupled to a drain terminal of P15 and a drain terminal coupled to yet another center node 406 which develops the POSC signal. It is noted that the bulk connections of each of the PMOS transistors may instead be coupled to VDD, and that the bulk connections of each of the NMOS transistors may instead be coupled to GND.

N11, N13, and N15 each have a source terminal and a bulk connection coupled to GND. N12 has a source terminal and bulk connection coupled to a drain terminal of N11 and a drain terminal coupled to node 402. N14 has a source terminal and bulk connection coupled to a drain terminal of N13 and a drain terminal coupled to node 404. N16 has a source terminal and bulk connection coupled to a drain terminal of N15 and a drain terminal coupled to node 406. P14 and N14 have their gate terminals coupled together at node 402 and P16 and N16 have their gate terminals coupled together at node 404. P11 and P15 have their gate terminals coupled together at node 208 and N11 and N15 have their gate terminals coupled together at node 218. P12 has its gate terminal coupled to node 202 and P13 as its gate terminal coupled to node 206. N12 has its gate terminal coupled to node 212 and N13 as its gate terminal coupled to node 216. It is understood that although in this particular embodiment the same nodes where the capacitor CEE is connected are coupled to the gates of devices P12 and N12, other pairs of nodes (i.e., 204-214, 206-216, 208-218, 210-220) could be used instead to connect the two ring oscillators with CEE.

The voltage signals developed on nodes 202, 206, 208, 212, 216, and 218 are used by the amplification circuitry 108 to produce a "rail-to-rail" output between VDD and GND. Initially, the signals on corresponding nodes 202 and 212 are used to drive P12 and N12, respectfully, of an inverting stage. Because of the initially slow rising and falling edges of the signals on corresponding nodes 202 and 212, however, a regular inverter, such as only including P12 and N12, may experience large short-circuit or "shoot-through" current. P11 is inserted between VDD and P12 and driven by the signal on node 208, and N11 is inserted between GND and N12 and driven by the signal on the corresponding node 218. These clocked outer devices are added to avoid such large short-circuit current within the first inverting stage. In this manner, time-shifted signals with different phases driving the inverting stage and the clocking devices are used to generate a rail-to-rail signal on node 402 while avoiding any shoot-through current.

The rail-to-rail voltage on node 402 is used to drive a second inverting stage including P14 and N14 to develop another rail-to-rail voltage on node 404. The second inverting stage also includes outer devices P13 (coupled between VDD and P14) and N13 (coupled between GND and N14), in which P13 is driven by the voltage on node 206 while N13 is driven by the voltage on corresponding node 216. In addition, the rail-to-rail voltage generated on node 404 is used to drive a third inverting stage including P16 and N16 to develop POSC as another rail-to-rail voltage on node 406. The third inverting stage also includes outer devices P15 (coupled between VDD and P16) and N15 (coupled between GND and N16), in which P15 is driven by the voltage on node 208 while N15 is driven by the voltage on corresponding node 218. The second and third inverting stages are each used to further increase the output transition slopes while minimizing the shoot-through current. It is understood that the number of stages in the amplification circuitry 108 can vary from one to as many as it is considered necessary for the generation of the POSC signal, assuming the proper use of the available phase-shifted signals to avoid short-circuit currents. If a finer phase difference is desired between the different signals driving the amplification circuitry, ring oscillators with a larger number of stages, and hence a larger number of available phases, can be used.

Figure 5:
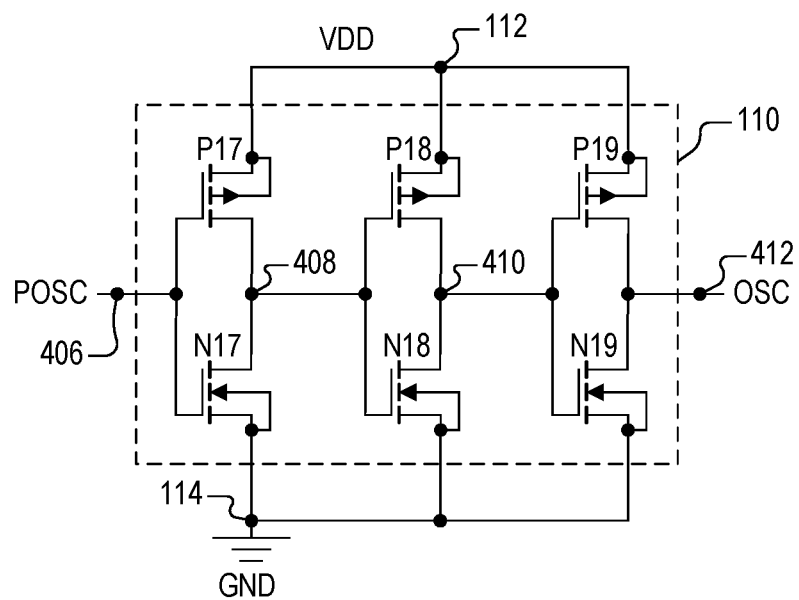
FIG. 5 is a schematic diagram of the buffer circuitry of FIG. 1 implemented according to one embodiment of the present disclosure.

FIG. 5 is a schematic diagram of the buffer circuitry 110 implemented according to one embodiment of the present disclosure. Below a certain rise and fall time, long-channel inverters may become more power efficient than their clocked counterpart for a similar gain. For that reason, the buffer circuitry 110 may be provided including a last set of inverting stages which use regular inverters (with longer than minimum channels) to improve the output signal transitions slopes. The buffer circuitry 110 includes P-channel devices P17, P18, and P19, and corresponding N-channel devices N17, N18, and N19. P17, P18, and P19 each has its source terminal and bulk connection coupled to VDD, and N17, N18, and N19 each has its source terminal and bulk connection coupled to GND. The gate terminals of P17 and N17 are coupled together at node 406 for receiving POSC and the drain terminals of P17 and N17 are coupled together at a node 408. The gate terminals of P18 and N18 are coupled together at node 408 and the drain terminals of P18 and N18 are coupled together at a node 410. The gate terminals of P19 and N19 are coupled together at node 410 and the drain terminals of P19 and N19 are coupled together at a node 412 which develops the output oscillation signal OSC. In this manner, P17 and N17 are coupled in series between VDD and GND to form a first inverting stage from POSC to node 408, P18 and N18 are coupled in series between VDD and GND to form a second inverting stage from node 408 to node 410, and P19 and N19 are coupled in series between VDD and GND to form a third inverting stage from node 410 to output node 412 providing the oscillating output signal OSC. It is noted that although the buffer circuitry 110 includes 3 stages, it is understood that if buffer circuitry is provided, it may include any number of stages such as 1 or more stages.

Figure 6:
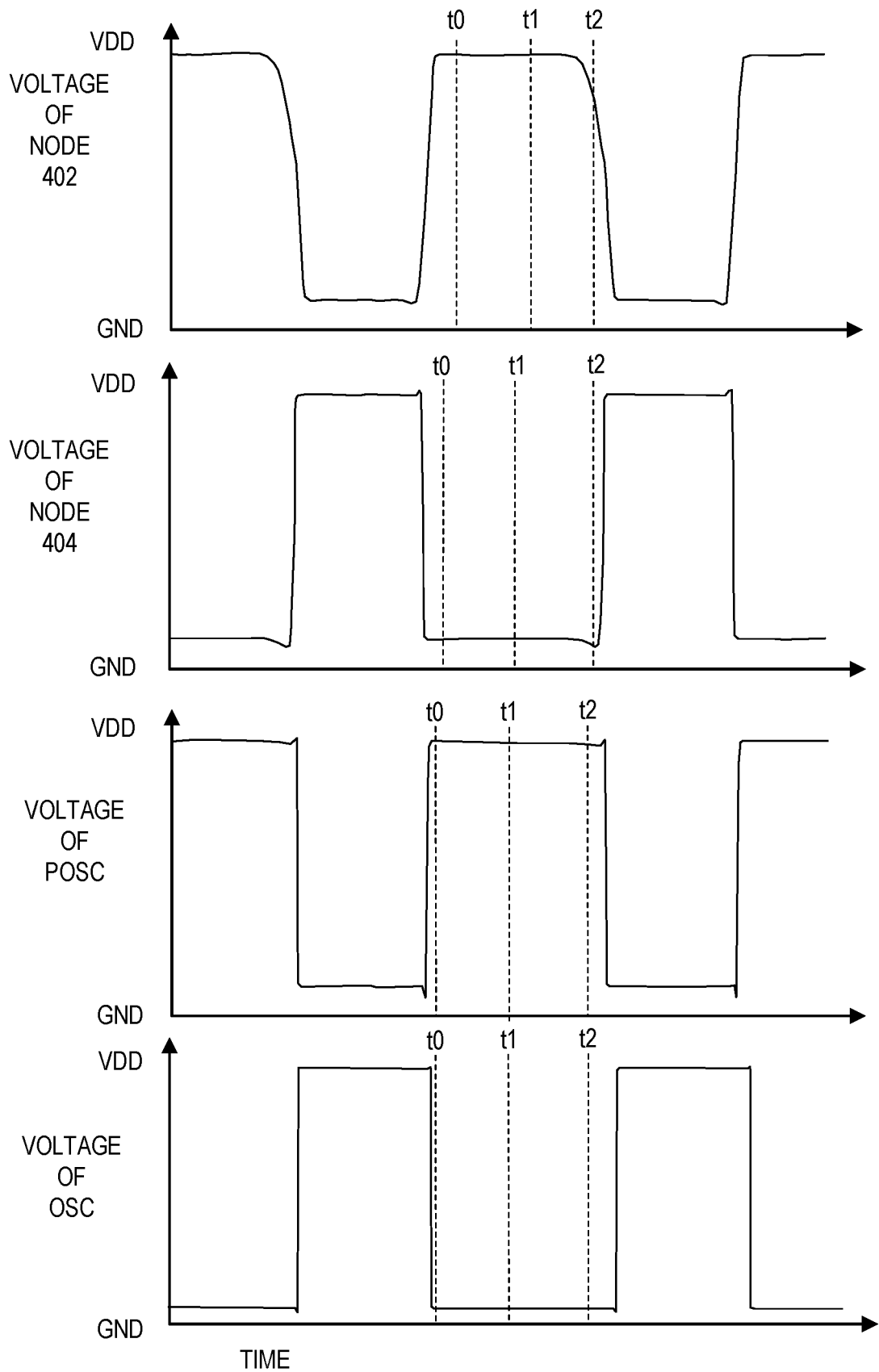
FIG. 6 is a series of timing diagrams plotting aligned voltages of nodes of the amplification circuitry of FIG. 4 and voltage of the OSC signal from the buffer circuitry of FIG. 5 versus time according to one embodiment of the present disclosure.

FIG. 6 is a series of timing diagrams plotting aligned voltages of nodes 402, 404, and 406 (POSC) of the amplification circuitry 108 and voltage of the OSC signal from the buffer circuitry 110 versus time according to one embodiment of the present disclosure. Each of these nodes/voltages oscillate rail-to-rail between VDD and GND in response to being driven by the upper and lower ring oscillators 102 and 104. With reference back to FIG. 3, several time points t0, t1 and t2 are plotted once the upper and lower ring oscillators 102 and 104 stabilize and reach steady state oscillation. These same time points are plotted in each of the timing diagrams of FIG. 5. The voltage of node 402 at the output of the first inverting stage of the amplification circuitry 108 exhibits smaller slopes and relatively slow transitions. The voltage of node 404 at the output of the second inverting stage of the amplification circuitry 108 exhibits somewhat larger slopes and faster transitions. The voltage of node 406 at the output of the third inverting stage of the amplification circuitry 108, which is the POSC signal, exhibits faster and cleaner transitions. The voltage of node 412 at the output of the buffer circuitry 110, which is the OSC signal, exhibits very fast and very clean transitions. The buffer circuitry 110 may be omitted depending upon the requirements of the particular configuration.

Figure 7:
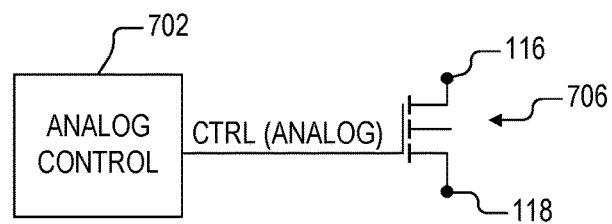
FIG. 7 is a simplified schematic and block diagram illustrating a controller which may be used as the controller of FIG. 1 for analog control according to one embodiment of the present disclosure.

FIG. 7 is a simplified schematic and block diagram illustrating a controller 706 which may be used as the controller 106 for analog control according to one embodiment of the present disclosure. The controller 706 is illustrated as a single MOS transistor device having current terminals coupled between the upper and lower intermediate nodes 116 and 118. The MOS transistor is shown generically and may be either an NMOS or a PMOS transistor depending upon the particular configuration, with its bulk connection appropriately coupled (e.g., source terminal, VDD GND, etc.). Although only one transistor device is shown, it is understood that it may be implemented with multiple transistor devices coupled in parallel, or any other circuit that modifies the injected current or impedance at the command of an electric signal. Analog control circuitry 702 generates the CTRL as an analog voltage signal provided to the control terminal of the controller 706, in which CTRL has a voltage level that is varied between a minimum voltage level and a maximum voltage level for adjusting the frequency of the oscillator 100 (hence, a voltage-controlled oscillator or VCO). For example, as the voltage of CTRL is increased, the impedance of the controller 706 decreases thereby increasing the current through the upper and lower ring oscillators 102 and 104 to increase the frequency of operation.

Figure 8:
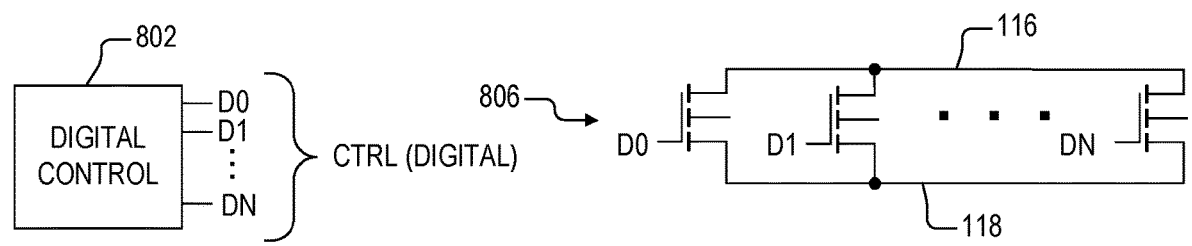
FIG. 8 is a simplified schematic and block diagram illustrating a controller which may be used as the controller of FIG. 1 for digital control according to another embodiment of the present disclosure.

FIG. 8 is a simplified schematic and block diagram illustrating a controller 806 which may be used as the controller 106 for digital control according to another embodiment of the present disclosure. The controller 806 is illustrated as N+1 MOS transistor devices coupled in parallel, each having current terminals coupled between the upper and lower intermediate nodes 116 and 118. Each of the MOS transistors are shown generically and may be either NMOS or PMOS transistors depending upon the particular configuration, with their bulk connection appropriately coupled (e.g., source terminal, VDD GND, etc.). N may be any suitable integer number greater than zero, and the transistor devices may or may not be equally-sized. Digital control circuitry 802 generates CTRL as digital signal with N+1 individual bits D1, D2, . . . , DN, each provided to the control terminal of a respective one of the N+1 transistor devices of the controller 806. The controller 806 provides CTRL as a digital value that is varied between a minimum level (e.g., all zero's or vice-versa) and a maximum voltage level (e.g., all one's or vice-versa) for adjusting the frequency of the oscillator 100 (hence, a digital controlled oscillator of DCO). In one embodiment, each bit either turns on or off the corresponding MOS transistor device to adjust the impedance of the controller 806 to adjust the operating frequency. Although each transistor device is shown as a single transistor, it is understood that each may be implemented with multiple transistor devices coupled in parallel, or with any other circuit that modifies the injected current or impedance at the command of an electric signal.

Figure 9:
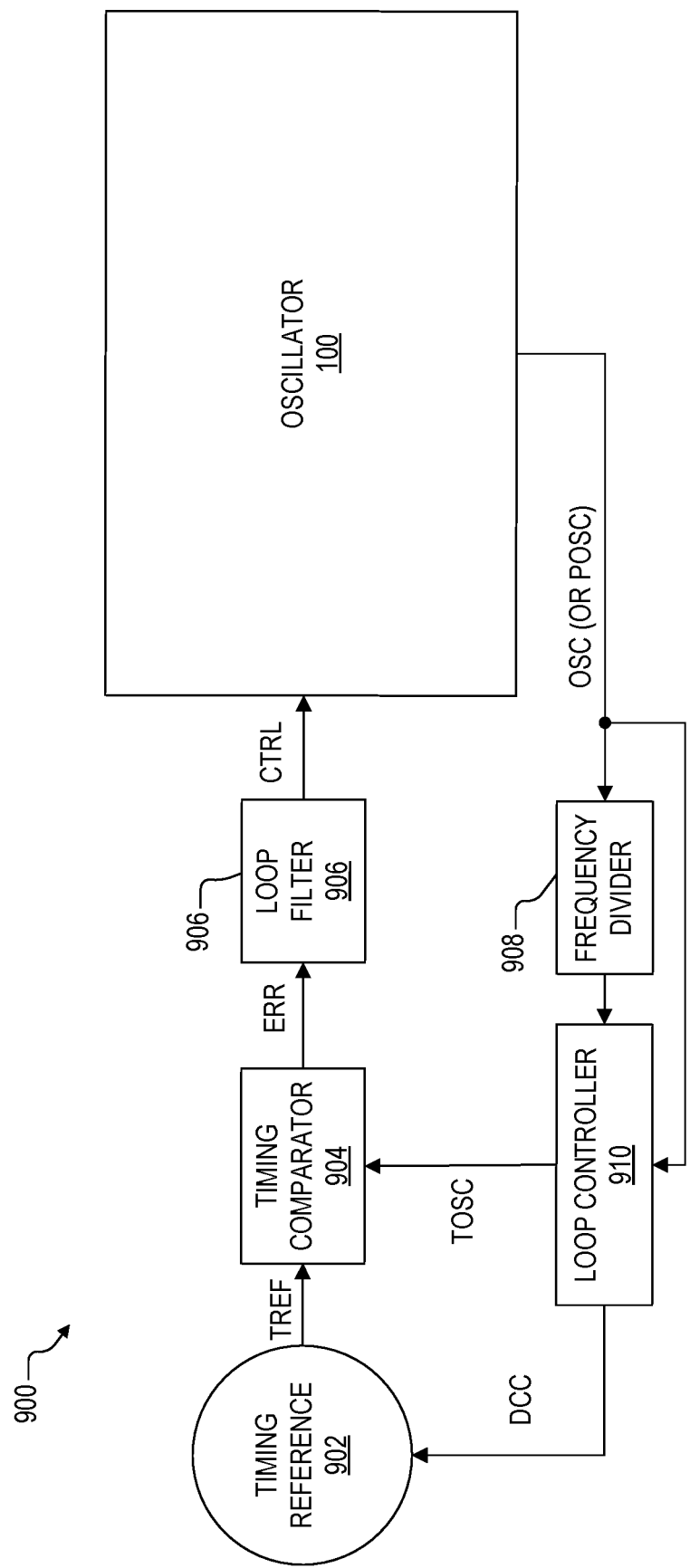
FIG. 9 is a simplified block diagram of a closed loop configuration using the oscillator of FIG. 1 to improve the accuracy and reduce the spread of the output oscillating signal according to one embodiment of the present disclosure.

FIG. 9 is a simplified block diagram of a closed loop configuration 900 using the oscillator 100 to improve the accuracy and reduce the spread of the OSC signal according to one embodiment of the present disclosure. Timing reference circuitry 902 generates and provides a reference time value TREF to one input of a timing comparator 904. The timing reference circuitry 902 may be implemented as a resistor-capacitor (RC) timing circuit or the like. The timing comparator 904 has an output developing and providing an error signal ERR to an input of a loop filter 906, which has an output that develops and provides the CTRL signal to the oscillator 100. The oscillator 100 develops and outputs OSC (or POSC if the buffer circuitry 110 is not included) to an input of a frequency divider 908 and to an input of a loop controller 910. The frequency divider 908 has an output providing a divided frequency signal to another input of the loop controller 910, which develops and provides a timing signal TOSC to another input of the timing comparator 904. The loop controller 910 may also provide a duty cycle control (DCC) signal to the timing reference circuitry 902 for controlling duty cycle. In one embodiment, TREF may represent a target period of OSC while TOSC may represent a corresponding measured period of OSC or POSC.

In operation, the timing comparator 904 compares TREF with TOSC to provide ERR used to adjust CTRL and thus the frequency of OSC (or POSC) until TOSC matches TREF. DCC may be used to adjust duty cycle. The closed loop configuration 900 illustrates an example of using the oscillator 100 within a closed loop to improve accuracy of the frequency of the output OSC (or POSC) signal.

Figure 10:
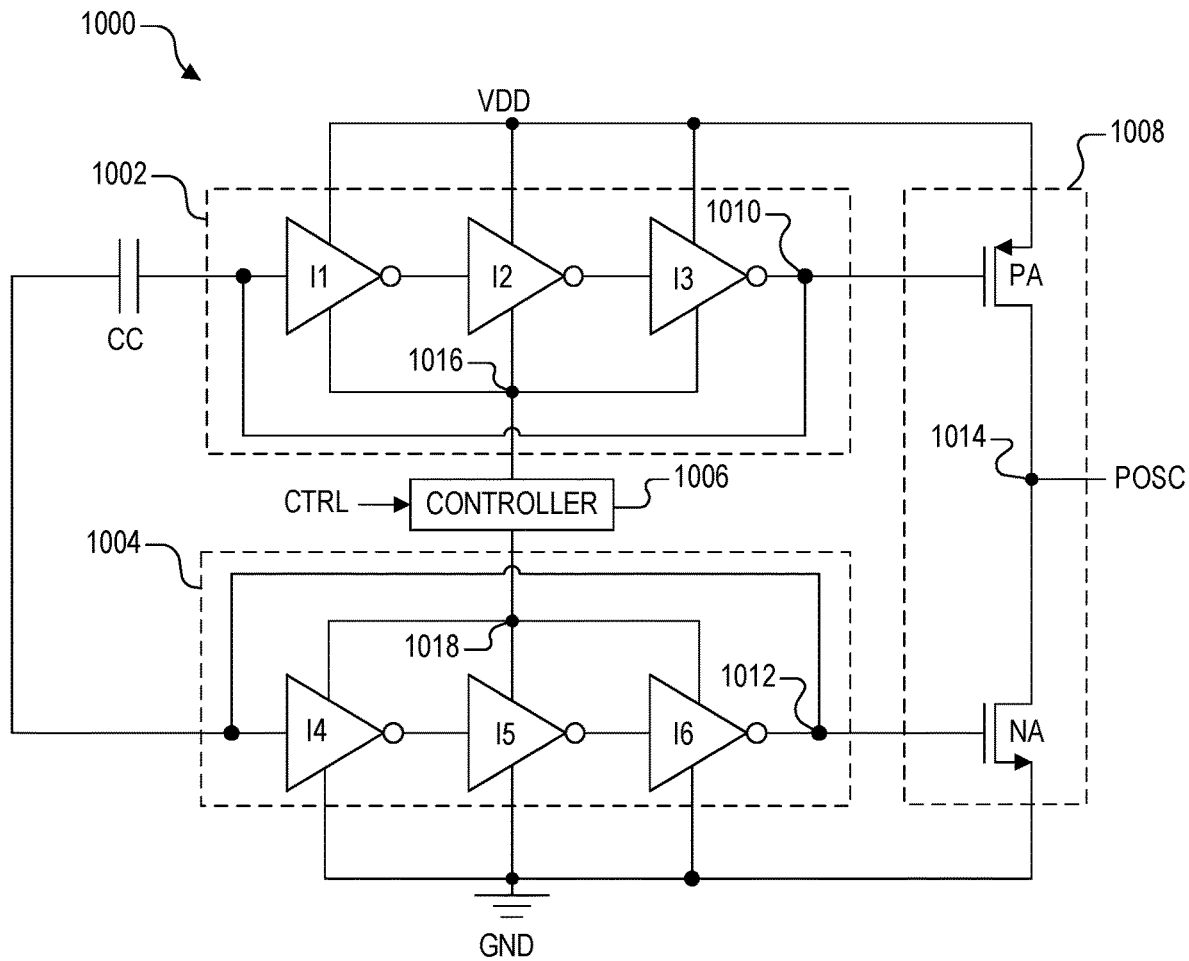
FIG. 10 is a schematic diagram of an oscillator implemented according to another embodiment of the present disclosure.

FIG. 10 is a simplified schematic and block diagram of a controllable oscillator 1000 implemented according to another embodiment of the present disclosure. The oscillator 1000 includes an upper ring oscillator 1002, a lower ring oscillator 1004, a controller 1006, and an amplification circuitry 1008. The upper ring oscillator 1002 is coupled between VDD and an upper intermediate node 1016 and the lower ring oscillator 1004 is coupled between a lower intermediate node 1018 and GND. The controller 1006 is coupled between the upper and lower intermediate nodes 1016 and 1018 and receives a control signal CTRL. The amplification circuitry 1008 is coupled between VDD and GND. The upper ring oscillator 1002 includes inverters I1, I2, and I3 coupled in series in a cascade configuration. I1 has an input coupled to a node 1010 and has an output coupled to an input of I2, which has an output coupled to an input of I3, which has an output coupled to node 1010 in ring fashion. The lower ring oscillator 1004 includes inverters I4, I5, and I6 coupled in series in a cascade configuration. I4 has an input coupled to a node 1012 and has an output coupled to an input of I5, which has an output coupled to an input of I6, which has an output coupled to node 1012 in ring fashion. A coupling capacitor CC is coupled between nodes 1010 and 1012. The amplification circuitry 1008 includes a PMOS transistor PA and an NMOS transistor NA. PA has a source terminal coupled to VDD, a gate terminal coupled to node 1010, and a drain terminal coupled to an output node 1014 developing POSC. NA has a source terminal coupled to the output node 1014, a gate terminal coupled to node 1012, and a drain terminal coupled to GND.

The inverters I1-I3 each have an upper supply terminal coupled to VDD and a lower supply terminal coupled to the upper intermediate node 1006. The inverters I4-I6 each have an upper supply terminal coupled to the lower intermediate node 1018 and a lower supply terminal coupled to GND. In this manner, the inverters I1-I3 are DC-shifted towards VDD while the inverters I4-I6 are DC-shifted towards GND in a similar manner described previously for the upper and lower ring oscillators 102 and 104. The amplification circuitry 1008 converts the DC-shifted upper and lower oscillation signals of the ring oscillators 1002 and 1004 into the rail-to-rail primary oscillation signal POSC that transitions between VDD and GND in a similar manner as previously described. The controller 1006 may be configured in any suitable manner for voltage, current, or digital control as previously described.

Various modifications are contemplated. The upper and lower ring oscillators 1002 and 1004 may include any odd number of cascaded inverters. Additional coupling devices or circuitry may be included, such as coupled between corresponding intermediate nodes of the inverters I1-I3 and I4-I6. Decoupling capacitors may be included, such as coupled between VDD and node 1016 and between node 1018 and GND, in which such decoupling capacitors may facilitate synchronization between the upper and lower ring oscillators 1002 and 1004. Although the amplification circuitry 1008 includes only one stage, additional stages may be included, and each stage may include additional cascoded (e.g., stacked) devices in a similar manner as previously described to avoid any direct current path. Buffer circuitry may be provided including one or more buffer stages.

It is further noted that FIGS. 1, 2 and 10 illustrate embodiments using ring oscillators as the upper and lower oscillators. Ring oscillators provide one or more intermediate nodes facilitating synchronization between the upper and lower oscillators. It is understood, however, that the upper and lower oscillators may be implemented with other types of oscillators in which the present invention is not limited solely to ring oscillators.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims. For example, variations of positive circuitry or negative circuitry may be used in various embodiments in which the present invention is not limited to specific circuitry polarities, device types or voltage levels or the like. For example, circuitry states, such as circuitry low and circuitry high may be reversed depending upon whether the pin or signal is implemented in positive or negative circuitry or the like. In some cases, the circuitry state may be programmable in which the circuitry state may be reversed for a given circuitry function.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The invention claimed is:
1. A controllable oscillator, comprising:
an upper oscillator coupled between an upper supply voltage and an upper intermediate node that is configured to provide at least one upper oscillating signal on at least one upper oscillating node;
a lower oscillator coupled between a lower intermediate node and a lower supply voltage that is configured to provide at least one lower oscillating signal on at least one lower oscillating node;

an oscillation controller coupled between the upper intermediate node and the lower intermediate node; and amplification circuitry coupled between the upper supply voltage and the lower supply voltage, having at least one upper input coupled to the at least one upper oscillating node, having at least one lower input coupled to the at least one lower oscillating node, and having a primary output node for providing a primary oscillation signal that oscillates between the upper supply voltage and the lower supply voltage.

2. The controllable oscillator of claim 1, further comprising a coupling circuit coupled between the at least one upper oscillating node and the at least one lower oscillating node.

3. The controllable oscillator of claim 2, wherein the coupling circuit comprises a coupling capacitor.

4. The controllable oscillator of claim 1, wherein the amplification circuitry comprises:
 an upper transistor having current terminals coupled between the upper supply voltage and the primary output node and having a control terminal coupled to the at least one upper oscillating node; and
 a lower transistor having current terminals coupled between primary output node and the lower supply voltage and having a control terminal coupled to the at least one lower oscillating node.

5. The controllable oscillator of claim 1, wherein the upper oscillator comprises a plurality of phase-shifted upper oscillating nodes, and wherein the lower oscillator comprises a plurality of phase-shifted lower oscillating nodes.

6. The controllable oscillator of claim 5, further comprising at least one coupling circuit, each of the at least one coupling circuitry coupled between one of the plurality of phase-shifted upper oscillating nodes and a corresponding one of the plurality of phase-shifted lower oscillating nodes.

7. The controllable oscillator of claim 5, wherein the amplification circuitry comprises:
 an upper P-channel transistor and a lower P-channel transistor having current terminals coupled in series between the upper supply voltage and the primary output node, wherein the upper P-channel transistor has a control terminal coupled to a first one of the phase-shifted upper oscillating nodes, and wherein the lower P-channel transistor has a control terminal coupled to a second one of the phase-shifted upper oscillating nodes; and
 an upper N-channel transistor and a lower N-channel transistor having current terminals coupled in series between the primary output node and the lower supply voltage, wherein the upper N-channel transistor has a control terminal coupled to a first one of the phase-shifted lower oscillating nodes, and wherein the lower N-channel transistor has a control terminal coupled to a second one of the phase-shifted lower oscillating nodes.

8. The controllable oscillator of claim 5, wherein the amplification circuitry comprises a plurality of amplifier stages, each comprising an upper P-channel transistor and a lower P-channel transistor having current terminals coupled in series between the upper supply voltage and a corresponding one of a plurality of center nodes including the primary output node, and an upper N-channel transistor and a lower N-channel transistor having current terminals coupled in series between a corresponding center node and the lower supply voltage.

9. The controllable oscillator of claim 8, wherein the plurality of amplifier stages comprises a first amplifier stage, comprising:
 a first upper P-channel transistor and a first lower P-channel transistor having current terminals coupled in series between the upper supply voltage and a first center node, and a first upper N-channel transistor and a first lower N-channel transistor having current terminals coupled in series between the first center node and the lower supply voltage; and
 wherein the first upper P-channel transistor has a control terminal coupled to a first one of the phase-shifted upper oscillating nodes, wherein the first lower P-channel transistor has a control terminal coupled to a second one of the phase-shifted upper oscillating nodes, wherein the upper N-channel transistor has a control terminal coupled to a first one of the phase-shifted lower oscillating nodes, and wherein the lower N-channel transistor has a control terminal coupled to a second one of the phase-shifted lower oscillating nodes.

10. The controllable oscillator of claim 9, wherein the plurality of amplifier stages comprises a second amplifier stage, comprising:
 a second upper P-channel transistor and a second lower P-channel transistor having current terminals coupled in series between the upper supply voltage and a second center node, and a second upper N-channel transistor and a second lower N-channel transistor having current terminals coupled in series between the second center node and the lower supply voltage; and
 wherein the second upper P-channel transistor has a control terminal coupled to a third one of the phase-shifted upper oscillating nodes, wherein the second lower P-channel transistor has a control terminal coupled to the first center node, wherein the second upper N-channel transistor has a control terminal coupled to the first center node, and wherein the second lower N-channel transistor has a control terminal coupled to a third one of the phase-shifted lower oscillating nodes.

11. The controllable oscillator of claim 10, wherein the plurality of amplifier stages comprises a third amplifier stage, comprising:
 a third upper P-channel transistor and a third lower P-channel transistor having current terminals coupled in series between the upper supply voltage and the primary output node, and a third upper N-channel transistor and a third lower N-channel transistor having current terminals coupled in series between the primary output node and the lower supply voltage; and
 wherein the third upper P-channel transistor has a control terminal coupled to the first one of the phase-shifted upper oscillating nodes, wherein the third lower P-channel transistor has a control terminal coupled to the second center node, wherein the third upper N-channel transistor has a control terminal coupled to the second center node, and wherein the third lower N-channel transistor has a control terminal coupled to the first one of the phase-shifted lower oscillating nodes.

12. The controllable oscillator of claim 1, further comprising:
 a first decoupling capacitor coupled between the upper supply voltage and the upper intermediate node; and
 a second decoupling capacitor coupled between the lower intermediate node and the lower supply voltage.

13. The controllable oscillator of claim 1, wherein the oscillation controller comprises a plurality of transistors each having current terminals coupled between the upper and lower intermediate nodes, and each having a control terminal receiving a corresponding one of a plurality of bits of a digital control value.

14. The controllable oscillator of claim 1, wherein the oscillation controller comprises a transistor having current terminals coupled between the upper and lower intermediate nodes and having a control terminal receiving an analog control voltage.

15. The controllable oscillator of claim 1, further comprising buffer circuitry coupled between the upper supply voltage and the lower supply voltage, having an input for coupled to the primary output node and having an output for providing an output oscillating signal, wherein the buffer circuitry is configured to optimize transition times of the output oscillating signal between the upper supply voltage and the lower supply voltage.

16. The controllable oscillator of claim 15, wherein the buffer circuitry comprises a plurality of inverters coupled in series having an input for receiving the primary oscillation signal and having an output for providing the output oscillating signal.

17. The controllable oscillator of claim 16, wherein the plurality of inverters includes a first inverter having an input for receiving the primary oscillation signal and an output providing a first oscillation signal, includes a second inverter having an input for receiving the first oscillation signal and an output providing a second oscillation signal, and including a third inverter having an input for receiving the second oscillation signal and having an output for providing a third oscillation signal.

18. The controllable oscillator of claim 16, wherein each the plurality of inverters comprises a P-channel transistor and an N-channel transistor having current terminals coupled in series between the upper supply voltage and the lower supply voltage.

19. The controllable oscillator of claim 1, wherein:
the upper oscillator comprises a first plurality of inverters coupled in series in a first ring configuration forming a plurality of upper oscillating nodes; and
wherein the lower oscillator comprises a second plurality of inverters coupled in series in a second ring configuration forming a plurality of lower oscillating nodes.

20. The controllable oscillator of claim 19, wherein each of the first and second plurality of inverters comprises a P-channel transistor coupled in series with an N-channel transistor.

* * * * *